(12) United States Patent
Campos Canton et al.

(10) Patent No.: US 8,587,343 B2
(45) Date of Patent: Nov. 19, 2013

(54) RECONFIGURABLE DYNAMIC LOGIC GATE WITH LINEAR CORE

(75) Inventors: Eric Campos Canton, San Luis Potosi (MX); Isaac Campos Canton, Guanajuato (MX); Haret Codratian Rosu, San Luis Potosi (MX)

(73) Assignee: Instituto Potosino de Investigacion Cientifica y Tecnologica A.C., San Luis Potosi (MX)

( * ) Notice: Subject to any disclaimer, the term of this patent is extended or adjusted under 35 U.S.C. 154(b) by 0 days.

(21) Appl. No.: 13/483,146

(22) Filed: May 30, 2012

(65) Prior Publication Data
US 2013/0002293 A1    Jan. 3, 2013

Related U.S. Application Data

(60) Provisional application No. 61/502,502, filed on Jun. 29, 2011.

(51) Int. Cl.
*H03K 19/20* (2006.01)

(52) U.S. Cl.
USPC ............................................ 326/104; 326/37

(58) Field of Classification Search
USPC ............................................ 326/37, 38, 104
See application file for complete search history.

(56) References Cited

U.S. PATENT DOCUMENTS

| | | | |
|---|---|---|---|
| 5,646,546 A | 7/1997 | Bertolet | |
| 5,748,009 A | 5/1998 | Bertolet | |
| RE35,977 E | 12/1998 | Cliff | |
| 6,025,735 A | 2/2000 | Gardner | |
| 7,096,437 B2 | 8/2006 | Ditto et al. | |
| 7,415,683 B2 | 8/2008 | Ditto et al. | |
| 7,453,285 B2 | 11/2008 | Kiel | |
| 7,482,834 B2 | 1/2009 | Dasari et al. | |
| 7,863,937 B2 | 1/2011 | Ditto et al. | |
| 7,924,059 B2 | 4/2011 | Ditto et al. | |
| 7,925,131 B2 | 4/2011 | Bogoni | |
| 7,925,814 B2 | 4/2011 | Schneiderwind | |
| 7,973,566 B2 | 7/2011 | Ditto et al. | |
| 8,091,062 B2 | 1/2012 | Ditto et al. | |
| 2010/0219858 A1 | 9/2010 | Ditto et al. | |
| 2011/0006807 A1* | 1/2011 | Schneiderwind | 326/39 |
| 2011/0062986 A1* | 3/2011 | Ditto et al. | 326/38 |

OTHER PUBLICATIONS

Murali, et al., "Chaos computing: experimental realization of NOR gate using a simple chaotic circuit". Physics Letters A, vol. 339, pp. 39-44, Mar. 8, 2005.
Murali, et al., "Experimental realization of chaos control by thresholding". Physical Review E., vol. 68, Jul. 14, 2003.
Campos-Cantón, et al., "A simple circuit with dynamic logic architecture of basic logic gates", International Journal of Bifurcation and Chaos, vol. 20, pp. 2547-2551, Aug. 2010.
Campos-Cantón, et al., "Set-Reset Flip-Flop Circuit with a simple Output Logic", Circuits, Systems & Signal Processing, 31, pp. 753-760, Apr. 2012.

* cited by examiner

*Primary Examiner* — Don Le
(74) *Attorney, Agent, or Firm* — Defillo & Associates, Inc.; Evelyn A. Defillo

(57) ABSTRACT

A dynamically reconfigurable linear core logic gate is a device that allows logical outputs dependent upon configurable parameters set within device. The device is comprised of three blocks: The first block receives at least one input signal and determines whether the signal or signals are low or high in comparison with a threshold reference signal. The second block sums the logic signals of the first block with an offset signal. The third block determines if the sum realized in the second block is a low or high by checking whether the sum falls within a predetermined interval.

11 Claims, 5 Drawing Sheets

RECONFIGURABLE DYNAMIC LOGIC GATE WITH LINEAR CORE

REFERENCE TO RELATED APPLICATIONS

This application is a non-provisional application based on U.S. Provisional Application No. 61/502,502 filed on Jun. 29, 2011, the content of which is incorporated by reference into this application.

FIELD OF THE INVENTION

The present invention relates to the field of dynamic computing and, more particularly, to dynamically configurable structures for linear core logic gates.

BACKGROUND INFORMATION

There is great interest in developing new working paradigms to complement and even replace current statically-wired computer architectures. One of the newest ideas is Chaos Computing which focuses on the development of devices with dynamic logic architecture and employs nonlinear or chaotic elements in logic operations. Application of chaos computing requires the development of dynamic logic gates (also called logic cells) that are able to change their response according to threshold reference signals and offset signals in order to produce different logic gates. These dynamic logic gates would support development of logic chips for next generation computers.

Current research that exploits the logic features of nonlinear dynamic systems through their electronic implementations, for example U.S. Pat. Nos. 8,091,062, 7,973,566, 7,924,059, 7,863,937, 7,415,683, 7,096,437, 7,453,285, 7,925,814, 7,925,131 and US patent application 2010/0219858, are related to chaotic computing architectures for logic gates based in nonlinear elements, while the present invention discloses dynamically configurable structures for linear core logic gates.

There are reports of computing modules that can be rewired to produce different outputs, but these devices employ static logic gates. For example, field programmable gate arrays (FPGAs) support rewiring and a limited degree of flexibility with respect to reconfiguration. Examples of modules that use static logic gates were presented in U.S. Pat. Nos. 6,025,735, 7,482,834, 5,748,009, 5,646,546 and Re. 35977. All are based on rewired static logic gates; different from the configurable structures for dynamic linear core logic gates presented in this application.

Reconfigurable computer modules based on chaotic or nonlinear elements (Chua's circuit or logistic map). Chua's circuit is easy to implement with off the shelf components. However, this device is not feasible to manufacture for integrated circuit technology because the required components (capacitors and inductor) occupy too much circuit area. The logistic map is based on a multiplier of its state, this produce the nonlinearity of the system and it is the core of the system. It should be noted that systems based on sensitive dependence on initial conditions are often very difficult to control in presence of noise because the nonlinear components.

In order to reduce the sensitive dependence on initial conditions of the nonlinear circuits and obtain a robust reconfigurable dynamic logic gate we have designed a method, circuit, array, and system to provide an implementation of a reconfigurable logic element using a linear core.

SUMMARY OF THE INVENTION

Briefly, the present invention discloses a reconfigurable dynamic logic gate with linear core comprising one input block, one summation block and an output block with at least one threshold reference signal and at least one offset signal to determine the behavior of the device as different basic logic gates. Said input block has a comparator that checks if the inputs signals are low or high signals, compared with a threshold reference signal, and generates for each input signal one output signal. Said summation block has an inverting summation circuit for the output signals of the input block and a noninverting summing circuit for the offset signal, and the output of the summation block is the input signal of the output block. Said output block with at least one threshold reference signal generates an interval and checks if the output signal of the summation belongs to the interval, and generates a high signal if the received signal is in the interval or low signal if the received signal is not in the interval. Also, the adjusting the offset signal and at least one threshold reference signal control the output signal of the circuit, wherein offset signal is adjusted to produce the logic gate output signal that corresponds to any one of:

an AND gate;
a NAND gate;
an OR gate;
an XOR gate;
a NOR gate; or
a NOT gate.

Furthermore, the adjusting the threshold reference signal of the input block and the voltage of the output signal in the output block serves to couple or connect to block with different references signals in the low and high logic state.

In an additional embodiment of the invention, it is disclosed and claimed a reconfigurable dynamic logic gate comprising:

a. an input comparator for receiving a first input signal and a second input signal to generate an output for each input signal, wherein if each input signal is greater that certain threshold then its output is a high logic state otherwise is a low logic state;

b. a summation block which combined an inverting summation and a noninverting summation circuit, wherein the summation has three inputs and one output; the two outputs of the input block are the inputs of the inverting summation and an offset signal to select the different logic gates is the input of the noninverting summation, and the output of the summer is the offset signal minus the adding of the outputs of the input block;

c. an output block which checked if the output signal of the summation block belongs to an interval or not compared to one threshold reference signal, wherein if the input signal belongs to the interval the output of the reconfigurable dynamic logic gate is a high logic state, otherwise is a low logic state.

The adjusting the offset signal and at least one threshold reference signal control the output signal of the circuit. Further, said offset signal is adjusted to produce the logic gate output signal that corresponds to any one of:

an AND gate;
a NAND gate;
an OR gate;
an XOR gate;
a NOR gate; or
a NOT gate.

Finally, the adjusting the threshold reference signal of the input block and the voltage of the output signal in the output block serves to coupled or connect to block with different references signals in the low and high logic state.

The present invention offers a reconfigurable dynamical logic linear core element. The linear core gives the robustness of the device against perturbations and easy controllability and implementation.

The forgoing and other features and advantages of the present invention will be apparent from the following more detailed description of the preferred embodiments of the invention, as illustrated in the accompanying drawings.

BRIEF DESCRIPTION OF THE DRAWINGS

For a more complete understanding of the present invention, and the advantages thereof, reference is now made to the following descriptions taken in conjunction with the accompanying drawings in which.

DESCRIPTION OF THE EMBODIMENTS

As required, detailed embodiments of the present invention are disclosed herein; however, it is to be understood that the disclosed embodiments are merely examples of the invention, which can be embodied in various forms. Therefore, specific structural and functional details disclosed therein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more that one. The term another, as used herein, is defined as at least a second or more. The terms including and/or having, as used herein, are defined as comprising (i.e. open language).

The following embodiments provide a direct and flexible implementation of logic operations using the dynamical evolution of a system with linear core. The various embodiments observer the state of the system at different times to obtain different logic outputs. The basic NAND, NOR, OR, XOR, NOT and AND logic gates. The single dynamic system can perform more complex operations such as all the logic functions.

The foregoing has outlined rather broadly the features and technical advantages of the present invention in order that the detailed description of the invention that follows may be better understood. Additional features and advantages of the invention will be described hereinafter which form the subject of the claims of the invention.

Figure 1:
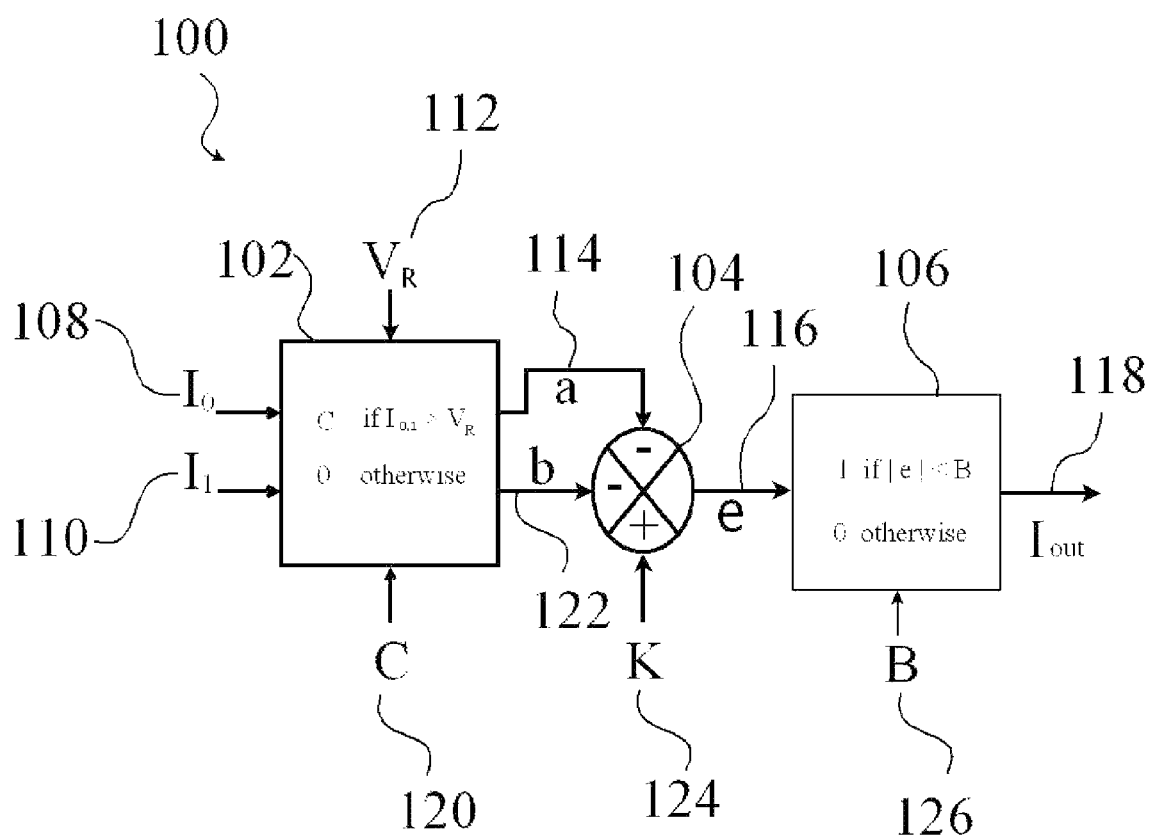
FIG. 1 is a schematic diagram of a reconfigurable dynamic logic gate with linear core.

In the following description, numerous specific details are set forth to provide a thorough understanding of the present invention. The block diagram of the reconfigurable dynamic logic gate is shown in FIG. 1. The operation of this circuit is due to the fact that the linear core of the system is a summation which is performed by two configurations known as inverting and noninverting summing amplifier in the summation block, as shown in FIG. 1. The input block checks if the input $I_0$ is a low logic state or high logic state and generates an output equal to zero logic or new high logic state C, respectively. The same operation for the second input $I_1$. With the outputs of the input block and the offset signal K, the second block estimates the signal e=K−a−b which is the input of the output block. This last block estimates the output $I_{out}$ equal to low or high logic states, these states can be defined according to requires. In one embodiment, all the basic logic gate operations, NAND, AND, NOR, XOR, OR, and NOT (see table I for the truth table), involve the following steps:

Input block (for a 2 inputs operation)

$$a = \begin{cases} C, & \text{if } I_0 > V_R \\ 0, & \text{otherwise,} \end{cases}$$

$$b = \begin{cases} C, & \text{if } I_1 > V_R \\ 0, & \text{otherwise,} \end{cases}$$

where $V_R$ is a threshold to decide when the input signals are high or low signals, C is a positive potential.

The summation block realized the following operation $$e = K - a - b,$$

this block is comprised by an inverting summation amplifier and a noninverting summation amplifier, and K is a offset signal (control parameter).

The output block decides if the output is a high or low logic state $$Iout = \begin{cases} 1, & \text{if } |e| < B \\ 0, & \text{otherwise.} \end{cases}$$

B is a positive parameter.

Since the core of the system is linear the system is robust against perturbations and it does not need to specify any initial condition as systems based on chaos. The action of K is to control that the e signal belongs to the interval (−B,B) or not.

TABLE I

| Input  | NOR | NAND | XOR | OR | AND | NOT |
|--------|-----|------|-----|----|----|-----|
| (0, 0) | 1   | 1    | 0   | 0  | 0  | 1   |
| (0, 1) | 0   | 1    | 1   | 1  | 0  |     |
| (1, 0) | 0   | 1    | 1   | 1  | 0  |     |
| (1, 1) | 0   | 0    | 0   | 1  | 1  | 0   |

The reconfigurable dynamic logic gate given in the three foregoing steps is controlled through the K parameter according to the intervals given in Table 2 and restricted to C/2<B≤C. For the NOT gate the first and second inputs have the same value (0,0) or (1,1).

TABLE 2

| When K ∈ | The gate is |
|---|---|
| [0, C − B] | NOR |
| (C − B, B) | NAND |
| [B, 2C − B] | XOR |
| (2C − B, C + B) | OR |
| [C + B, 2C] | AND |
| (C − B, B) | NOT |

In one embodiment, consider a reconfigurable dynamic logic gate 100 as shown in FIG. 1. The reconfigurable dynamic logic gate 100 comprises an input block 102, and summation 104 and an output block 106. The input block 102 has two inputs 108 and 110, two outputs 114 and 122, and two control signals 112 and 120. The input signal 112 fixes a threshold in order to determine when the input signals 108 and 110 are low logic state or high logic state. The control signal 120 fixes the value of the new high logic state for the outputs of 114 and 122. The core of the system is a summation 104 that comprises an inverting summing amplifier for the signal 114 and 122 and a noninverting summing amplifier for the signal 124. Then the output of the summation is the signal 116. The last block 106 has one input 116, one output 118 and a control signal 126. The control signal determines the interval (−B,B). The output block gives a high logic when the signal 116 belongs to the interval (−B,B) and a low logic state otherwise.

Figure 2:
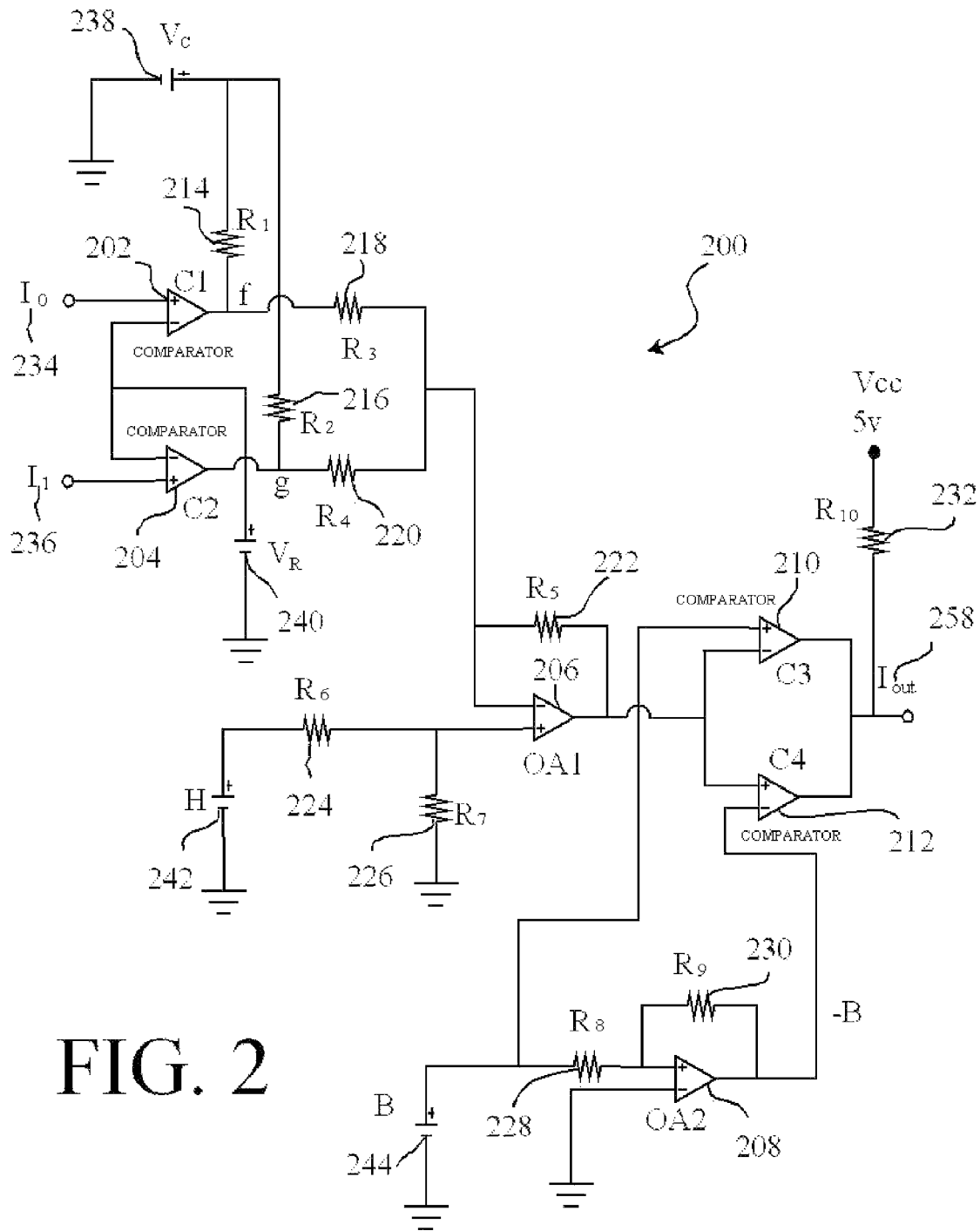
FIG. 2 is a circuit schematic of the reconfigurable dynamic logic gate with linear core of FIG. 1 according to one embodiment of the present invention.
Figure 3:
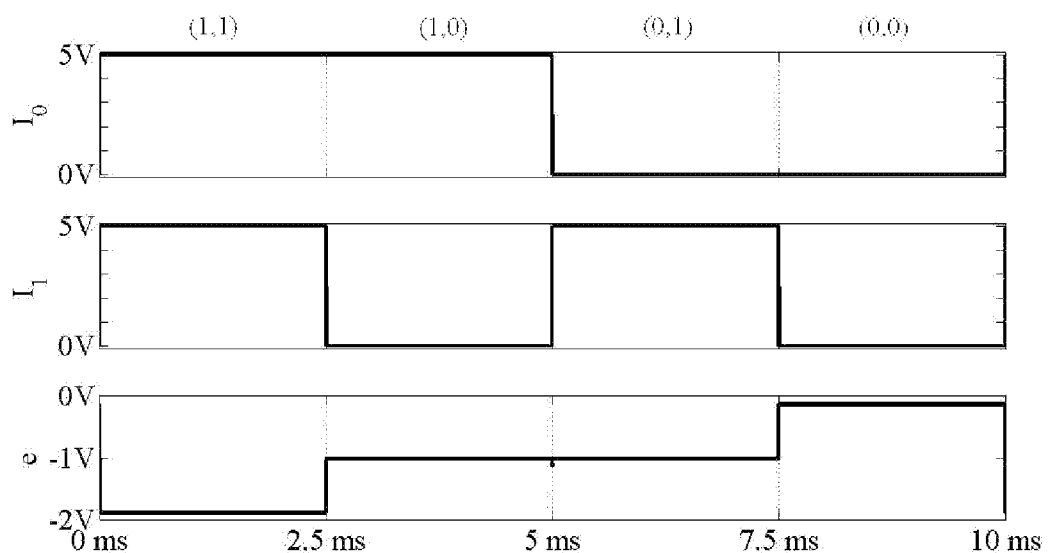
FIG. 3 shows the input signals $I_0$ and $I_1$ and the output signal e of the summation block of the reconfigurable dynamic logic gate of FIG. 2 according to one embodiment of the present invention.
Figure 4:
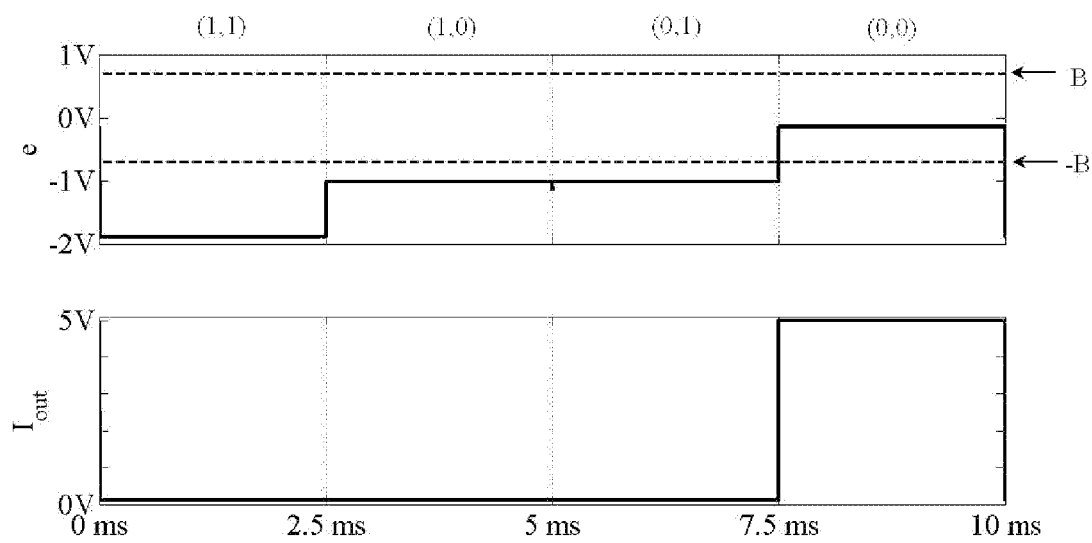
FIG. 4 shows the signal e and the output signal $I_{out}$ of the reconfigurable dynamic logic gate of FIG. 2 when it is responded as a NOR logic gate according to one embodiment of the present invention.
Figure 5:
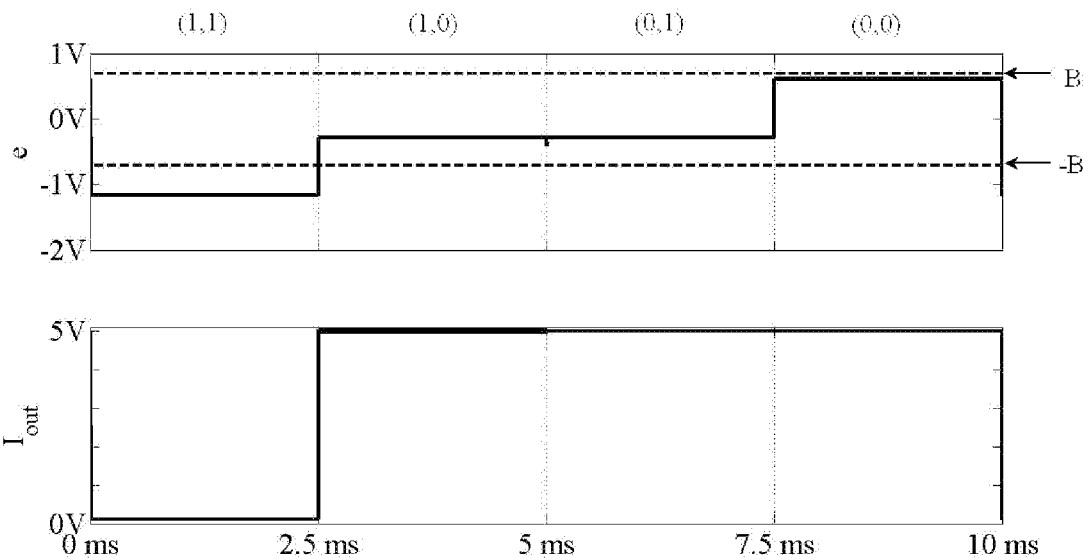
FIG. 5 shows the signal e and the output signal $I_{out}$ of the reconfigurable dynamic logic gate of FIG. 2 when it is responded as a NAND logic gate according to one embodiment of the present invention.
Figure 6:
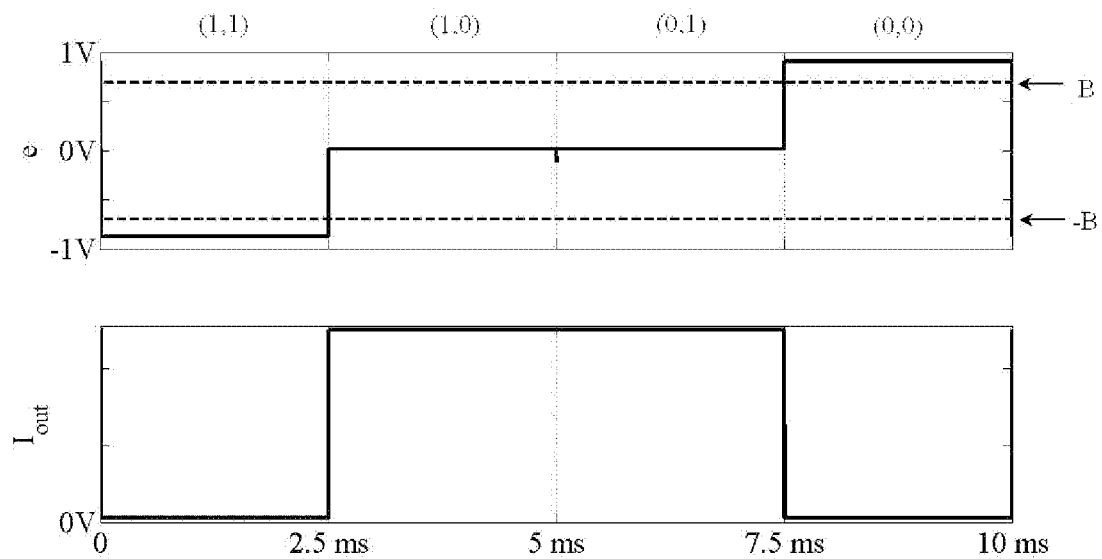
FIG. 6 shows the signal e and the output signal $I_{out}$ of the reconfigurable dynamic logic gate of FIG. 2 when it is responded as an XOR logic gate according to one embodiment of the present invention.
Figure 7:
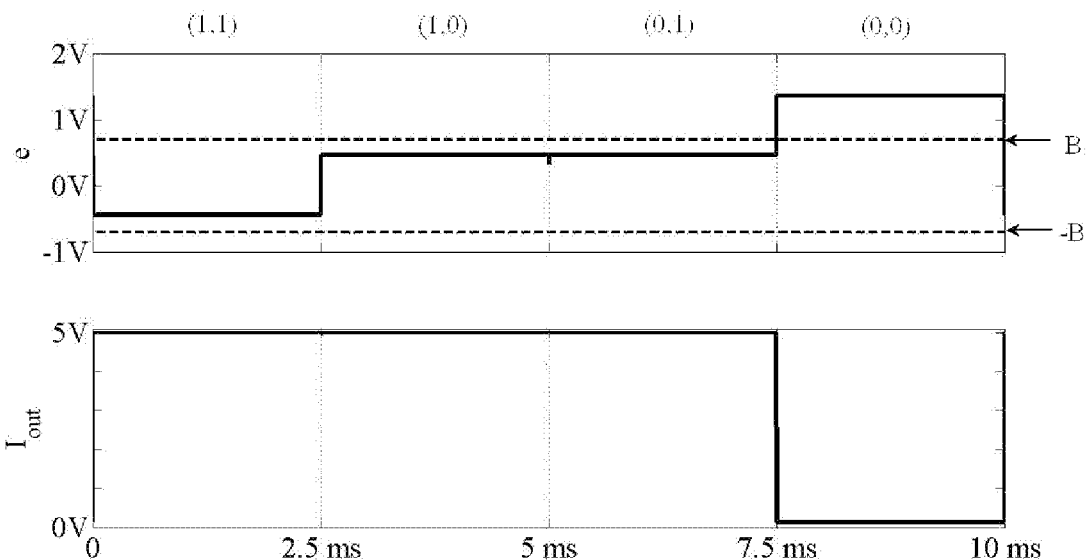
FIG. 7 shows the signal e and the output signal $I_{out}$ of the reconfigurable dynamic logic gate of FIG. 2 when it is responded as an OR logic gate according to one embodiment of the present invention.
Figure 8:
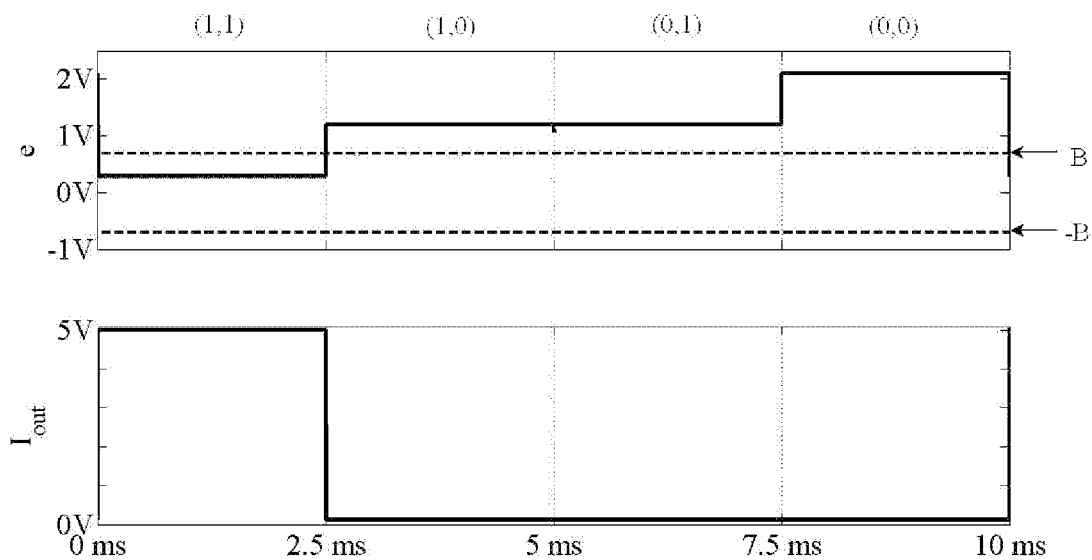
FIG. 8 shows the signal e and the output signal $I_{out}$ of the reconfigurable dynamic logic gate of FIG. 2 when it is responded as an AND logic gate according to one embodiment of the present invention.

One example of a circuit for implementing the reconfigurable dynamic logic gate 100 of FIG. 1 is shown in FIG. 2. The schematic experimental circuit diagram 200 of the reconfigurable dynamic logic gate is shown in FIG. 2. In particular, FIG. 2 is more detailed view of the logic gate 100 of FIG. 1. This circuit consists of two operational amplifiers 206 and 208 such as (but not limited to) Op-amps TL081 or AD712 or μA 741. The circuit 200 also includes, four comparators 202, 204, 210 and 212 realized, in this example, with LM311, ten resistors ($R_1$-$R_{10}$) 214, 216, 218, 220, 222, 224, 226, 228, 230 and 232. The circuit with comparators (C1) 202 and (C2) 204 compare the inputs signals ($I_o$) 234 and ($I_1$) 236 with the threshold voltages ($V_R$) 240. The output of the comparator 202 and 204 are given as follows $$f = \begin{cases} \dfrac{R_5}{R_1 + R_5} V_C, & \text{if } I_0 > V_R, \\ 0, & \text{if } I_0 \leq V_R, \end{cases}$$

$$g = \begin{cases} \dfrac{R_4}{R_2 + R_4} V_C, & \text{if } I_1 > V_R, \\ 0, & \text{if } I_1 \leq V_R, \end{cases}$$

the output of the op amp 206 is as follows>

$$e = \left( \dfrac{1 + \dfrac{R_5}{R_1 + R_5} + \dfrac{R_5}{R_2 + R_4}}{1 + \dfrac{R_6}{R_7}} \right) H - \left( \dfrac{R_5}{R_3} f + \dfrac{R_5}{R_4} g \right)$$

Lastly, the outputs of comparators C3 210 and C4 212 as functions of the voltage in node e are $$C3(e) = \begin{cases} v_{cc}, & \text{if } B > e, \\ 0, & \text{otherwise,} \end{cases}$$

$$C4(e) = \begin{cases} v_{cc}, & \text{if } e > -B, \\ 0, & \text{otherwise.} \end{cases}$$

What is claimed is:

1. A reconfigurable dynamic logic gate with linear core comprising:
   one input block;
   one summation block; and
   an output block with at least one threshold reference signal and at least one offset signal to determine the behavior of the device as different basic logic gates.

2. The reconfigurable dynamic logic gate of claim 1, wherein the input block has a comparator that checks if the inputs signals are low or high signals, compared with a threshold reference signal, and generates for each input signal one output signal.

3. The reconfigurable dynamic logic gate of claim 1, wherein the summation block has an inverting summation circuit for the output signals of the input block and a noninverting summing circuit for the offset signal, and the output of the summation block is the input signal of the output block.

4. The reconfigurable dynamic logic gate of claim 1, wherein the output block with at least one threshold reference signal generates an interval and checks if the output signal of the summation belongs to the interval, and generates a high signal if the received signal is in the interval or low signal if the received signal is not in the interval.

5. The reconfigurable dynamic logic gate of claim 1, wherein the adjusting the offset signal and at least one threshold reference signal control the output signal of the circuit.

6. The reconfigurable dynamical logic gate of claim 1, wherein offset signal is adjusted to produce the logic gate output signal that corresponds to any one of:
   an AND gate;
   a NAND gate;
   an OR gate;
   an XOR gate;
   a NOR gate; or
   a NOT gate.

7. The reconfigurable dynamic logic gate of claim 1, wherein the adjusting the threshold reference signal of the input block and the voltage of the output signal in the output block serves to coupled or connect to block with different references signals in the low and high logic state.

8. A reconfigurable dynamic logic gate comprising:
   an input comparator for receiving a first input signal and a second input signal to generate an output for each input signal, wherein if each input signal is greater that certain threshold then its output is a high logic state otherwise is a low logic state;
   a summation block which combined an inverting summation and a noninverting summation circuit, wherein the summation has three inputs and one output; the two outputs of the input block are the inputs of the inverting summation and an offset signal to select the different logic gates is the input of the noninverting summation, and the output of the summer is the offset signal minus the adding of the outputs of the input bloc; and an output block which checked if the output signal of the summation block belongs to an interval or not compared to one threshold reference signal, wherein if the input signal belongs to the interval the output of the reconfigurable dynamic logic gate is a high logic state, otherwise is a low logic state.

9. The reconfigurable dynamic logic gate of claim 8, wherein the adjusting the offset signal and at least one threshold reference signal control the output signal of the circuit.

10. The reconfigurable dynamic logic gate of claim 8, wherein offset signal is adjusted to produce the logic gate output signal that corresponds to any one of:
   an AND gate;
   a NAND gate;
   an OR gate;
   an XOR gate;
   a NOR gate; or
   a NOT gate.

11. The reconfigurable dynamic logic gate of claim 8, wherein the adjusting the threshold reference signal of the input block and the voltage of the output signal in the output block serves to coupled or connect to block with different references signals in the low and high logic state.

* * * * *